United States Patent
Broyde et al.

(10) Patent No.: US 7,642,849 B2
(45) Date of Patent: Jan. 5, 2010

(54) MULTIPLE-INPUT AND MULTIPLE-OUTPUT AMPLIFIER

(75) Inventors: Frederic Broyde, Maule (FR); Evelyne Clavelier, Maule (FR)

(73) Assignee: Excem SAS, Maule (FR)

( * ) Notice: Subject to any disclaimer, the term of this patent is extended or adjusted under 35 U.S.C. 154(b) by 82 days.

(21) Appl. No.: 12/096,701

(22) PCT Filed: Dec. 19, 2006

(86) PCT No.: PCT/IB2006/003950

§ 371 (c)(1),
(2), (4) Date: Jun. 9, 2008

(87) PCT Pub. No.: WO2007/083191

PCT Pub. Date: Jul. 26, 2007

(65) Prior Publication Data
US 2008/0272840 A1 Nov. 6, 2008

(30) Foreign Application Priority Data
Jan. 17, 2006 (FR) .................................. 06 00388

(51) Int. Cl.
*H03F 3/68* (2006.01)
(52) U.S. Cl. ............................ 330/147; 330/148; 330/84
(58) Field of Classification Search .................. 330/84, 330/124 R, 147, 148, 295
See application file for complete search history.

(56) References Cited

U.S. PATENT DOCUMENTS

| 5,604,462 | A | 2/1997 | Gans et al. |
| 5,955,920 | A | 9/1999 | Reudink et al. |
| 7,574,181 | B2 * | 8/2009 | Copeland ............... 455/103 |
| 2008/0057880 | A1 * | 3/2008 | Copeland ............... 455/101 |

FOREIGN PATENT DOCUMENTS

| FR | 2 849 728 | 7/2004 |
| WO | WO 2004/062129 | 7/2004 |

\* cited by examiner

*Primary Examiner*—Steven J Mottola
(74) *Attorney, Agent, or Firm*—Barnes & Thornburg LLP

(57) ABSTRACT

The invention relates to an amplifier capable of producing a plurality of currents at its output terminals, these currents being controlled by a plurality of input voltages. A multiple-input and multiple-output amplifier of the invention includes 4 signal input terminals, 4 signal output terminals, 4 active sub-circuits and a feedback network. Each active sub-circuit has a sub-circuit input terminal connected to one of the signal input terminals, a sub-circuit output terminal connected to one of the signal output terminals and a sub-circuit common terminal. The feedback network has terminals connected to the sub-circuit common terminal of each active sub-circuit. The feedback network presents, in a known frequency band, an impedance matrix producing a negative feedback such that the transfer admittance matrix of the multiple-input and multiple-output amplifier approximates a given admittance matrix.

10 Claims, 6 Drawing Sheets

MULTIPLE-INPUT AND MULTIPLE-OUTPUT AMPLIFIER

CROSS-REFERENCE TO RELATED APPLICATIONS

The present application claims the benefit of priority under 35 U.S.C. 119 to International Patent Application No. PCT/IB2006/003950 filed Dec. 19, 2006, which claims the benefit of priority to France Patent Application No. 0600388 filed Jan. 17, 2006, the contents of which are hereby incorporated by reference in their entirety.

FIELD OF THE INVENTION

The invention relates to an amplifier capable of producing a plurality of currents at its output terminals, these currents being controlled by a plurality of input voltages.

The French patent application number 06/00388 of 17 Jan. 2006, entitled "Amplificateur à entrées multiples et sorties multiples" is incorporated by reference.

PRIOR ART

Let us consider the problem of designing an amplifier having a plurality of output terminals, these output terminals behaving as the terminals of a linear circuit whose short-circuit currents are each a linear combination of a plurality of input voltages, in a frequency band.

Let us number these output terminals from 0 to n, where 0 corresponds to the "reference terminal" which will be used as a reference for measuring voltages, and which is often called the ground terminal. Any integer j greater than or equal to 1 and less than or equal to n corresponds to the number of a signal output terminal of the amplifier, that is to say to an output terminal other than the reference terminal. This integer may therefore be used as an index in order to define, for each signal output terminal, two electrical variables, i.e. one current and one voltage. We define in this manner the output current $i_j$ flowing into the signal output terminal j, and the output voltage $v_j$ between the signal output terminal j and the reference terminal. We can also define the column-vector I of the output currents $i_1, \ldots, i_n$ and the column-vector V of the output voltages $v_1, \ldots, v_n$.

Let us now number the input voltages from 1 to n. Let E be the column-vector of the n input voltages $e_1, \ldots, e_n$ with respect to the reference terminal. The ideal behavior expected from the amplifier defined above is clearly expressed, in the frequency domain and at frequencies different from 0 Hz, by the following matrix equation:

$$I = Y_T E + Y_O V \quad (1)$$

where $Y_T$ and $Y_O$ are n×n matrices. All components of these matrices have the dimensions of admittance. Consequently, we will refer to $Y_T$ as the "transfer admittance matrix" of the amplifier, and to $Y_O$ as the "output admittance matrix" of the amplifier. These two matrices may be frequency-dependent.

A quiescent current at the output can be considered as part of the ideal behavior of the amplifier. Consequently, at the frequency 0 Hz, the appropriate matrix equation for the ideal behavior expected from the amplifier defined above is $$I = Y_T E + Y_O V + I_0 \quad (2)$$

where $I_0$ is the column-vector of the output currents for E=0 and V=0. In a real amplifier, the equation (1) can nevertheless be considered as a small-signal approximation, valid for a given quiescent operating point, at all frequencies.

The amplifier defined above can unambiguously be called a multiple-input and multiple-output transadmittance amplifier. If we disregard the case of a plurality of independent transadmittance amplifiers each having a single input and a single output (in this case the transfer admittance matrix is diagonal), the only type of multiple-input and multiple-output transadmittance amplifier commonly found in the literature is the differential pair, for which the output currents are the two collector currents (in the case of an implementation using bipolar transistors) or the two drain currents (in the case of an implementation using field-effect transistors). In the small-signal approximation, the differential pair becomes linear, and the ideal behavior expected from a differential pair in which the emitter currents are supplied by a current source corresponds to $$Y_T = \begin{pmatrix} G_{TB} & -G_{TB} \\ -G_{TB} & G_{TB} \end{pmatrix} \quad (3)$$

where $G_{TB}$ is a conductance depending on biasing. We note that this matrix is neither diagonal nor invertible.

A general theory of multiple-input, multiple-output feedback amplifier is well known to specialists. Elements of this theory are for instance presented in the chapter 29 of the book *The Circuits and Filters Handbook* edited by W.-K. Chen, published by CRC Press, Inc. in 1995. However, the study of this chapter indicates that this general theory is in practice used for studying multiple-loop feedback amplifiers having a single physical input and a single physical output. It should be noted that, in this theory, and contrary to the concepts used in the present application, the current flowing into an input terminal of such an amplifier can be regarded as an output variable. This theory does not seem to have been applied to the design of multiple-input and multiple-output transadmittance amplifiers having a non-diagonal transfer admittance matrix.

Multiple-input and multiple-output transadmittance amplifiers having a non-diagonal transfer admittance matrix are used in the French patent application number 03 00064 of 6 Jan. 2003, entitled "Procédé et dispositif pour la transmission avec une faible diaphonie", corresponding to the international application number PCT/EP2003/015036 of 24 Dec. 2003, entitled "Method and device for transmission with reduced crosstalk", for instance in devices implementing the equation (19), the equation (22) or the equation (23) of these applications. However, the person skilled in the art understands that the types of design shown in the fourth embodiment and the fifth embodiment of these applications may be difficult to implement when n is greater than or equal to 3 and a wide bandwidth is needed.

SUMMARY OF THE INVENTION

The purpose of the invention is a multiple-input and multiple-output transadmittance amplifier having an equal number of inputs and outputs, without the limitations of known techniques.

A multiple-input and multiple-output amplifier of the invention, having one reference terminal, n signal input terminals and n signal output terminals, where n is an integer greater than or equal to 3, for providing, in a known frequency band, a transfer admittance matrix approximating a given admittance matrix, this given admittance matrix being a non-diagonal and invertible n×n matrix, comprises:
- n active sub-circuits, each active sub-circuit having a sub-circuit input terminal, a sub-circuit output terminal and a sub-circuit common terminal, the sub-circuit input terminal being connected to one of said signal input terminals and the sub-circuit output terminal being connected to one of said signal output terminals, each active sub-circuit being such that the current flowing out of the sub-circuit common terminal and the current flowing into the sub-circuit output terminal depend on the voltage between the sub-circuit input terminal and the sub-circuit common terminal, each said signal input terminal being connected to only one sub-circuit input terminal and each said signal output terminal being connected to only one sub-circuit output terminal;
- a feedback network having a terminal connected to said reference terminal, the feedback network also having n other terminals each being connected to the sub-circuit common terminal of one of said active sub-circuits, the feedback network presenting, in the known frequency band, a non-diagonal impedance matrix, this impedance matrix being defined with respect to said reference terminal, the feedback network producing a negative feedback such that, in the known frequency band, said transfer admittance matrix approximates said given admittance matrix.

At a given frequency f in said known frequency band, let us use $Y_G$ to denote said given admittance matrix, and $Z_{FB}$ to denote the impedance matrix of the feedback network with respect to said reference terminal. If j is an integer greater than or equal to 1 and less than or equal to n, we can use j to designate the active sub-circuit whose sub-circuit input terminal is connected to the signal input terminal j. We can consider that this active sub-circuit j has its sub-circuit output terminal connected to the signal output terminal j. Let us use $w_j$ to denote the voltage of the sub-circuit common terminal of the active sub-circuit j with respect to the reference terminal, and W to denote the column-vector of the voltages $w_1, \ldots, w_n$. For a first analysis of the principle of the invention, let us consider the special case for which $$i_{CAj} = y_{CTAj}(e_j - w_j) \qquad (4)$$

and $$i_{OAj} = y_{OTAj}(e_j - w_j) \qquad (5)$$

in which:
- $i_{CAj}$ is the current flowing out of the sub-circuit common terminal of the active sub-circuit j,
- $y_{CTAj}$ is the sub-circuit common terminal forward transfer admittance of the active sub-circuit j,
- $i_{OAj}$ is the current flowing into the sub-circuit output terminal of the active sub-circuit j, and
- $y_{OTAj}$ is the sub-circuit output terminal forward transfer admittance of the active sub-circuit j.

This case corresponds to a multiple-input and multiple-output amplifier of the invention in which the active sub-circuit j is such that the current flowing out of the sub-circuit common terminal and the current flowing into the sub-circuit output terminal may be considered as only depending on the voltage between the sub-circuit input terminal and the sub-circuit common terminal.

Let us use $\text{diag}_n(y_{CTA\,1}, \ldots, y_{CTA\,n})$ to denote the diagonal matrix of the sub-circuit common terminal forward transfer admittances $y_{CTAj}$, and $\text{diag}_n(y_{OTA\,1}, \ldots, y_{OTA\,n})$ to denote the diagonal matrix of the sub-circuit output terminal forward transfer admittances $y_{OTAj}$. Using equation (4), and assuming that the current $i_{CAj}$ flowing out of the sub-circuit common terminal of the active sub-circuit j is substantially equal to the current flowing into the corresponding terminal of the feedback network, and that the circuit is stable, we obtain:

$$W = Z_{FB} \text{diag}_n(y_{CTA\,1}, \ldots, y_{CTA\,n})(E - W) \qquad (6)$$

We then get $$E - W = [1_n + Z_{FB} \text{diag}_n(y_{CTA\,1}, \ldots, y_{CTA\,n})]^{-1} E \qquad (7)$$

where $1_n$ is the identity matrix of size n×n. Assuming that the current $i_{OAj}$ flowing into the sub-circuit output terminal of the active sub-circuit j is substantially equal to the current $i_j$ flowing into the signal output terminal j, and using equation (5), we obtain $$I = \text{diag}_n(y_{OTA\,1}, \ldots, y_{OTA\,n})[1_n + Z_{FB} \text{diag}_n(y_{CTA\,1}, \ldots, y_{CTA\,n})]^{-1} E \qquad (8)$$

Consequently, we get:

$$Y_T = \text{diag}_n(y_{OTA\,1}, \ldots, y_{OTA\,n})[1_n + Z_{FB} \text{diag}_n(y_{CTA\,1}, \ldots, y_{CTA\,n})]^{-1} \qquad (9)$$

and $$Y_O = 0_n \qquad (10)$$

where $0_n$ is the null matrix of size n×n. Consequently, with our assumptions, in order to obtain that the transfer admittance matrix $Y_T$ approximates said given admittance matrix $Y_G$, we must design the feedback network in such a way that $$Z_{FB} \approx [Y_G^{-1} \text{diag}_n(y_{OTA1}, \ldots, y_{OTA\,n}) - 1_n][\text{diag}_n(y_{CTA\,1}, \ldots, y_{CTA\,n})]^{-1} \qquad (11)$$

At this stage, we note that, in general, it is difficult to state if a feedback network having this impedance matrix can be realized at the frequency f. We note that, if the feedback network is made of linear, passive and reciprocal circuit elements, a necessary condition is that this impedance matrix is symmetrical.

Equation (9) shows that the negative feedback provided by the feedback network can be used to desensitize the transfer admittance matrix $Y_T$ with respect to variations in the sub-circuit common terminal forward transfer admittances $y_{CTAj}$. The specialist sees that this is a benefit, which is increased when the absolute values of the sub-circuit common terminal forward transfer admittances $y_{CTAj}$ are sufficiently increased. Using the mathematical results presented in paragraph 87 of the book Algèbre linéaire of V. Voïévodine, published by Editions Mir in 1976, we note that if the absolute values $|y_{CTA\,j}|$ of the sub-circuit common terminal forward transfer admittances are much larger than the absolute values of all components of the inverse of the impedance matrix $Z_{FB}$ of the feedback network, the following approximation is applicable:

$$(1_n + [Z_{FB} \text{diag}_n(y_{CTA\,1}, \ldots, y_{CTA\,n})]^{-1})^{-1} \approx 1_n \qquad (12)$$

Consequently, equation (9) becomes $$Y_T \approx \text{diag}_n\left(\frac{y_{OTA1}}{y_{CTA1}}, \ldots, \frac{y_{OTAn}}{y_{CTAn}}\right) Z_{FB}^{-1} \qquad (13)$$

and equation (11) becomes $$Z_{FB} \approx Y_G^{-1} diag_n\left(\frac{y_{OTA1}}{y_{CTA1}}, \ldots, \frac{y_{OTAn}}{y_{CTAn}}\right) \quad (14)$$

As will be shown below, the specialists know several designs appropriate for the active sub-circuits, which provide ratios $y_{OTAj}/y_{CTAj}$ close to 1 or to −1. In this case, with the assumptions detailed above, the negative feedback produced by the feedback network is such that the transfer admittance matrix $Y_T$ approximates said given admittance matrix $Y_G$, irrespective of the exact value of the sub-circuit common terminal forward transfer admittances $y_{CTAj}$. Also, in the cases where all ratios $y_{OTAj}/y_{CTAj}$ are close to 1 or where all ratios $y_{OTAj}/y_{CTAj}$ are close to −1, if the feedback network is made of linear, passive and reciprocal circuit elements, said given admittance matrix $Y_G$ must be symmetrical.

Consequently, according to the invention, said given admittance matrix may be symmetrical.

Consequently, according to the invention, said feedback network may be exclusively composed of linear, passive and reciprocal circuit elements.

Consequently, according to the invention, the multiple-input and multiple-output amplifier may be such that said active sub-circuits have an absolute value $|y_{CTAj}|$ of the ratio of the current flowing out of the sub-circuit common terminal to the voltage between the sub-circuit input terminal and the sub-circuit common terminal much larger than the absolute values of all components of the inverse of the impedance matrix $Z_{FB}$ of the feedback network.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
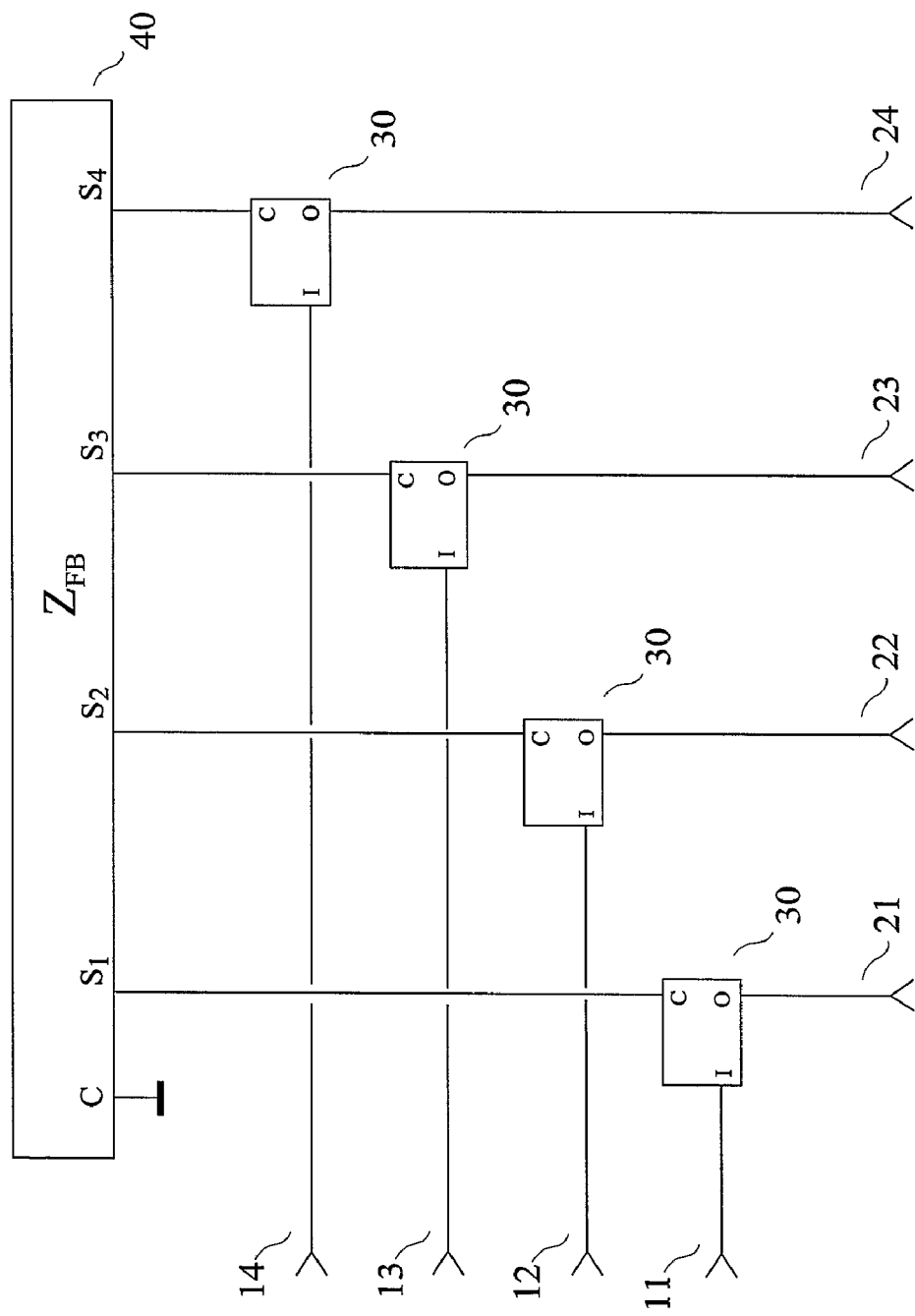
FIG. 1 shows a first embodiment of the invention, for n=4.

As a first embodiment of a device of the invention, given by way of non-limiting example, we have represented in FIG. 1 a multiple-input and multiple-output amplifier of the invention comprising 4 signal input terminals (11) (12) (13) (14), 4 signal output terminals (21) (22) (23) (24), 4 active sub-circuits (30) and a feedback network (40). Each active sub-circuit has a sub-circuit input terminal connected to one of the signal input terminals (11) (12) (13) (14), a sub-circuit output terminal connected to one of the signal output terminals (21) (22) (23) (24), and a sub-circuit common terminal. Each active sub-circuit is such that the current flowing out of the sub-circuit common terminal and the current flowing into the sub-circuit output terminal depend on the voltage between the sub-circuit input terminal and the sub-circuit common terminal. The feedback network (40) has a terminal connected to the reference terminal represented as the ground symbol in FIG. 1. The feedback network (40) also has 4 other terminals, each being connected to the sub-circuit common terminal of a different active sub-circuit (30). The feedback network presents, in the known frequency band, an impedance matrix $Z_{FB}$, this impedance matrix being defined with respect to said reference terminal, the feedback network producing a negative feedback such that, in the known frequency band, the transfer admittance matrix $Y_T$ of the multiple-input and multiple-output amplifier approximates said given admittance matrix $Y_G$.

Figure 2:
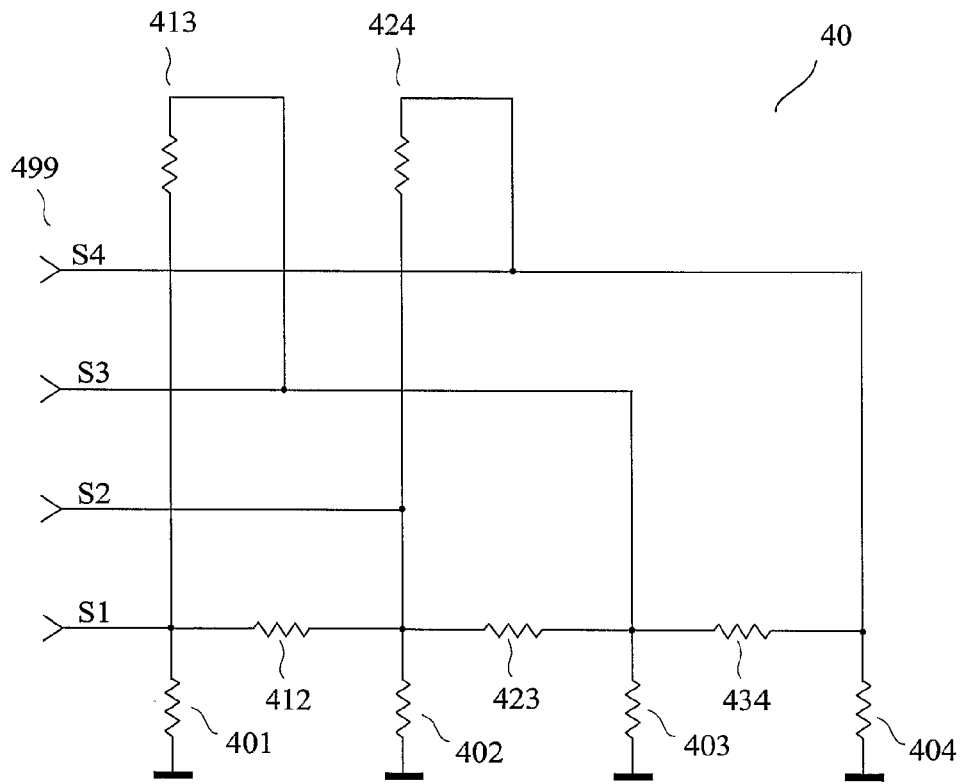
FIG. 2 shows a feedback network used in the first embodiment.

The schematic diagram of FIG. 2 shows a feedback network (40) for the circuit of FIG. 1, made of 9 resistors, having a terminal connected to the reference terminal (shown as the ground symbol) and four other terminals (499). Four resistors (401) (402) (403) (404) are connected between one of the other terminals (499) and the reference terminal. Five resistors (412) (423) (434) (413) (424) introduce non-diagonal components in the impedance matrix $Z_{FB}$ of the feedback network. Consequently, it is clear that the transfer admittance matrix $Y_T$ of the multiple-input and multiple-output amplifier shown in FIG. 1 cannot be diagonal.

Consequently, according to the invention, said feedback network may be a network of resistors. The person skilled in the art knows how to proportion such a feedback network to obtain a given real and symmetrical impedance matrix $Z_{FB}$.

A feedback network made of a network of resistors is however not at all a characteristic of the invention. By way of example, designers may include suitable reactive circuit elements (e.g. capacitors and/or inductors) in the feedback network. Another example is that the feedback network could include active circuit elements. This point will be addressed again at the end of the discussion of the ninth embodiment.

As shown in this first embodiment, according to the invention, the multiple-input and multiple-output amplifier may be such that the number n of signal output terminals is greater than or equal to 4.

Figure 3:
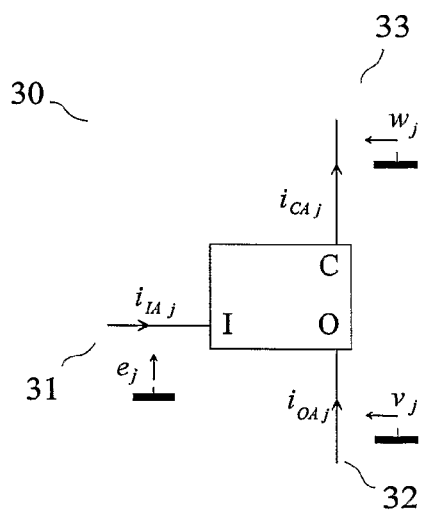
FIG. 3 shows an active sub-circuit used in the first embodiment.

We have represented in FIG. 3 the active sub-circuit j (30) having its sub-circuit input terminal (31) connected to the signal input terminal j and its sub-circuit output terminal (32) connected to the signal output terminal j. FIG. 3 shows the input voltage $e_j$ equal to the voltage between the sub-circuit input terminal (31) and the reference terminal, the output voltage $v_j$ equal to the voltage between the sub-circuit output terminal (32) and the reference terminal, and the voltage $w_j$ between the sub-circuit common terminal (33) and the reference terminal. FIG. 3 also shows the current $i_{IAj}$ flowing into the sub-circuit input terminal (31), the current $i_{OA\,j}$ flowing into the sub-circuit output terminal (32), and the current $i_{CA\,j}$ flowing out of the sub-circuit common terminal (33).

At a given frequency, the small-signal behavior of the active sub-circuit j (30) is conveniently described by the matrix $Y_{Aj}$ defined by $$\begin{pmatrix} i_{IAj} \\ i_{CAj} \\ i_{OAj} \end{pmatrix} = Y_{Aj} \begin{pmatrix} e_j \\ w_j \\ v_j \end{pmatrix} \quad (15)$$

where $$Y_{Aj} = \begin{pmatrix} y_{IAj} + y_{CMIAj} & y_{CMIAj} - y_{IAj} - y_{IRAj} & y_{IRAj} + y_{CMIAj} \\ y_{CTAj} - y_{CMCAj} & -y_{CTA} - y_{CRAj} - y_{CMCAj} & y_{CRAj} - y_{CMCAj} \\ y_{OTAj} + y_{CMOAj} & y_{CMOAj} - y_{OTAj} - y_{OAj} & y_{OAj} + y_{CMOAj} \end{pmatrix} \quad (16)$$

in which the parameters $y_{CTA\,j}$ and $y_{OTA\,j}$ have already been defined above and the seven other parameters are named as follows:

$y_{IA\,j}$ is the input admittance of the active sub-circuit j, $y_{CMIA\,j}$ is the common-mode sub-circuit input terminal admittance of the active sub-circuit j, $y_{IRA\,j}$ is the sub-circuit input terminal reverse transfer admittance of the active sub-circuit j, $y_{CMCA\,j}$ is the common-mode sub-circuit common terminal admittance of the active sub-circuit j, $y_{CRA\,j}$ is the sub-circuit common terminal reverse transfer admittance of the active sub-circuit j, $y_{CMOA\,j}$ is the common-mode sub-circuit output terminal admittance of the active sub-circuit j, and $y_{OA\,j}$ is the output admittance of the active sub-circuit j.

Each active sub-circuit j may have additional connections to the reference terminal and/or to one or more power supplies, even though such additional connections are not shown in FIGS. 1 and 3. We note that at least one such connection is necessarily present when the sum of the first row-vector and third row-vector of the matrix $Y_{A\,j}$ is not equal to its second row-vector.

In this first embodiment of a multiple-input and multiple-output amplifier of the invention, we see that the current $i_{CA\,j}$ flowing out of the sub-circuit common terminal of the active sub-circuit j is equal to the current flowing into the corresponding terminal of the feedback network, and that the current $i_{OA\,j}$ flowing into the sub-circuit output terminal of the active sub-circuit j is equal to the current $i_j$ flowing into the signal output terminal j.

The person skilled in the art understands that the matrices $Y_T$ and $Y_O$ can be computed as a function of the matrices $Y_{A\,j}$ and $Z_{FB}$. Consequently, it is possible to proportion the active sub-circuits and the feedback network in such a way that the negative feedback produces a transfer admittance matrix $Y_T$ which approximates said given admittance matrix $Y_G$. For instance, if the active sub-circuits are such that the parameters $y_{CMCA\,j}$, $y_{CRA\,j}$, $Y_{CMOA\,j}$, and $y_{OA\,j}$ can be regarded as equal to 0, equations (9) and (10) are applicable and we have seen above that requiring that $|y_{CTA\,j}|$ is sufficiently large and that the ratios $y_{OTA\,j}/y_{CTA\,j}$ are close to 1 leads to a possible design. However, other designs are clearly possible.

Second Embodiment (Best Mode)

The second embodiment of a device of the invention, given by way of non-limiting example and best mode of carrying out the invention, also corresponds to the multiple-input and multiple-output amplifier of the invention represented in FIG. 1, and all explanations provided for the first embodiment are applicable to this second embodiment. Additionally, in this second embodiment, all active sub-circuits have substantially identical properties. Consequently, at a given frequency, we can use the 9 following parameters:

$y_{CTA}$ is the sub-circuit common terminal forward transfer admittance of all active sub-circuits, $y_{OTA}$ is the sub-circuit output terminal forward transfer admittance of all active sub-circuits, $y_{IA}$ is the input admittance of all active sub-circuits, $y_{CMIA}$ is the common-mode sub-circuit input terminal admittance of all active sub-circuits, $y_{IRA}$ is the sub-circuit input terminal reverse transfer admittance of all active sub-circuits, $y_{CMCA}$ is the common-mode sub-circuit common terminal admittance of all active sub-circuits, $y_{CRA}$ is the sub-circuit common terminal reverse transfer admittance of all active sub-circuits, $y_{CMOA}$ is the common-mode sub-circuit output terminal admittance of all active sub-circuits, and $y_{OA}$ is the output admittance of all active sub-circuits.

The equation (16) describing the small-signal behavior of the active sub-circuit j (30) becomes:

$$Y_{Aj} = \begin{pmatrix} y_{IA} + y_{CMIA} & y_{CMIA} - y_{IA} - y_{IRA} & y_{IRA} + y_{CMIA} \\ y_{CTA} \; y_{CMCA} & -y_{CTA} - y_{CRA} - y_{CMCA} & y_{CRA} \; y_{CMCA} \\ y_{OTA} + y_{CMOA} & y_{CMOA} - y_{OTA} - y_{OA} & y_{OA} + y_{CMOA} \end{pmatrix} \quad (17)$$

We easily obtain $$Y_T = \begin{bmatrix} (y_{OTA} + y_{CMOA})1_n + \\ \begin{Bmatrix} y_{OTA}(y_{CRA} + 2y_{CMCA}) + \\ y_{CMOA}(y_{CRA} + 2y_{CTA}) + \\ y_{OA}(y_{CMCA} - y_{CTA}) \end{Bmatrix} Z_{FB} \end{bmatrix} \quad (18)$$

$$[1_n + (y_{CTA} + y_{CRA} + y_{CMCA})Z_{FB}]^{-1}$$

and $$Y_O = \begin{bmatrix} (y_{OA} + y_{CMOA})1_n + \\ \begin{Bmatrix} y_{OA}(y_{CTA} + 2y_{CMCA}) + \\ y_{CMOA}(y_{CTA} + 2y_{CRA}) + \\ y_{OTA}(y_{CMCA} - y_{CRA}) \end{Bmatrix} Z_{FB} \end{bmatrix} \quad (19)$$

$$[1_n + (y_{CTA} + y_{CRA} + y_{CMCA})Z_{FB}]^{-1}$$

Consequently, using equations (18) and (19), it is possible to proportion the active sub-circuits and the feedback network in such a way that the negative feedback produces a transfer admittance matrix $Y_T$ which approximates the given admittance matrix $Y_G$. This second embodiment shows that it is at the same time possible to proportion the active sub-circuits and the feedback network in such a way that the output admittance matrix $Y_O$ of the multiple-input and multiple-output amplifier approximates a wanted matrix. However, we note that, for a given matrix $Y_G$, this wanted matrix cannot be chosen arbitrarily, because the available parameters only leave a limited flexibility. The limits of this flexibility become obvious if we write the product $Y_O Y_T^{-1}$ using equations (18) and (19). Clearly, if we had not required that all active sub-circuits have substantially identical properties, the flexibility would have been greater.

According to the invention, the multiple-input and multiple-output amplifier may be such that the output admittance matrix of the multiple-input and multiple-output amplifier approximates a wanted matrix.

Third Embodiment

The third embodiment of a device of the invention, given by way of non-limiting example, also corresponds to the multiple-input and multiple-output amplifier of the invention represented in FIG. 1, and all explanations provided for the first embodiment are applicable to this third embodiment. Additionally, in this third embodiment, the active sub-circuits are such that the parameters $y_{CMCA\ j}$, $y_{CRA\ j}$, $y_{CMOA\ j}$, and $y_{OA\ j}$ can be regarded as equal to 0 and that the absolute values $|y_{CTA\ j}|$ of the sub-circuit common terminal forward transfer admittances are much larger than the absolute values of all components of the inverse of the impedance matrix $Z_{FB}$ of the feedback network. Using the equations (7) and (12), we obtain:

$$E - W \approx [Z_{FB} \mathrm{diag}_n(y_{CTA\ 1}, \ldots, y_{CTA\ n})]^{-1} E \qquad (20)$$

Consequently, in this case the absolute value $|e_j - w_j|$ of the voltage between the sub-circuit input terminal and the sub-circuit common terminal of the active sub-circuit j becomes much smaller than the largest of the absolute values of the input voltages. The specialist understands that an ideal active sub-circuit having a very large absolute value $|y_{CTA\ j}|$ of its sub-circuit common terminal forward transfer admittance will see a voltage $e_j - w_j$ between the sub-circuit input terminal and the sub-circuit common terminal near zero, as if the sub-circuit common terminal was the output of an ideal unity gain buffer having its input connected to the sub-circuit input terminal.

Let us now consider an ideal active sub-circuit j having a very large $|y_{CTA\ j}|$, and such that $y_{IA\ j} = y_{CMIA\ j} = y_{IRA\ j} = y_{CMCA\ j} = y_{CRA\ j} = y_{CMOA\ j} = y_{OA\ j} = 0$, and $y_{OTA\ j} = \pm y_{CTA\ j}$. These properties correspond to the ideal characteristics of a second-generation current conveyor (CCII) investigated in chapter 58 of the above-mentioned book entitled *The Circuits and Filters Handbook*. The case $y_{OTA\ j} = y_{CTA\ j}$ corresponds to the type of second-generation current conveyor called CCII− in this book, and the case $y_{OTA\ j} = -y_{CTA\ j}$ corresponds to the type of second-generation current conveyor called CCII+ in this book. With active sub-circuits each made of an ideal CCII, using equation (13) we find that the transfer admittance matrix of the multiple-input and multiple-output amplifier is $$Y_T \approx \pm Z_{FB}^{-1} \qquad (21)$$

the positive sign applying to the CCII− and the negative sign to the CCII+. The output admittance matrix of the multiple-input and multiple-output amplifier is of course given by equation (10).

Real second generation current conveyors may for instance be built using bipolar transistors and current mirrors. Such circuits may be adequate for bipolar operation (i.e. operation for which their instantaneous output current can be positive or negative) and/or unipolar operation (i.e. operation for which their instantaneous output current is either always positive or always negative). They can provide an excellent accuracy, but their bandwidth is typically less than 1 GHz. We note that some authors refer to the type of second-generation current conveyor called CCII+ as "positive second-generation current conveyor", "diamond transistor", or "operational transconductance amplifier". Some commercially available wide bandwidth CCII+ allowing bipolar operation for instance provide a typical $|y_{CTA\ j}|$ of more than 100 mA/V up to 300 MHz.

According to the invention, the multiple-input and multiple-output amplifier may be such that at least one of the active sub-circuits is a second-generation current conveyor.

Fourth Embodiment

Figure 4:
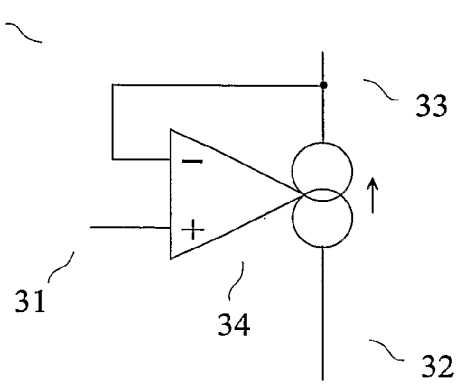
FIG. 4 shows an active sub-circuit comprising a voltage-controlled current source, used in the fourth embodiment.

The fourth embodiment of a device of the invention, given by way of non-limiting example, also corresponds to the multiple-input and multiple-output amplifier of the invention represented in FIG. 1, and all explanations provided for the first embodiment are applicable to this fourth embodiment. Additionally, in this fourth embodiment, any active sub-circuit j is such that $y_{IA\ j} = y_{CMIA\ j} = y_{IRA\ j} = y_{CMCA\ j} = y_{CRA\ j} = y_{CMOA\ j} = y_{OA\ j} = 0$, and such that $y_{CTA\ j} = y_{OTA\ j}$ (in the present case, we do not require having a very large $|y_{CTA\ j}|$). The active sub-circuit (30) shown in FIG. 4 provides these features. It is made of a voltage-controlled current source (34) having its negative input terminal connected to its positive output terminal (a voltage-controlled current source is an ideal circuit element such that the current flowing out of its positive output terminal is equal to the current flowing into its negative output terminal and is equal to a transconductance g multiplied by the potential difference between its positive input terminal and its negative input terminal, and such that there is no current flowing into the input terminals). The sub-circuit input terminal (31) is connected to the positive input terminal of the voltage-controlled current source (34), the sub-circuit output terminal (32) is connected to the negative output terminal of the voltage-controlled current source (34), and the sub-circuit common terminal (33) is connected to the negative input and positive output terminals of the voltage-controlled current source (34).

Figure 5:
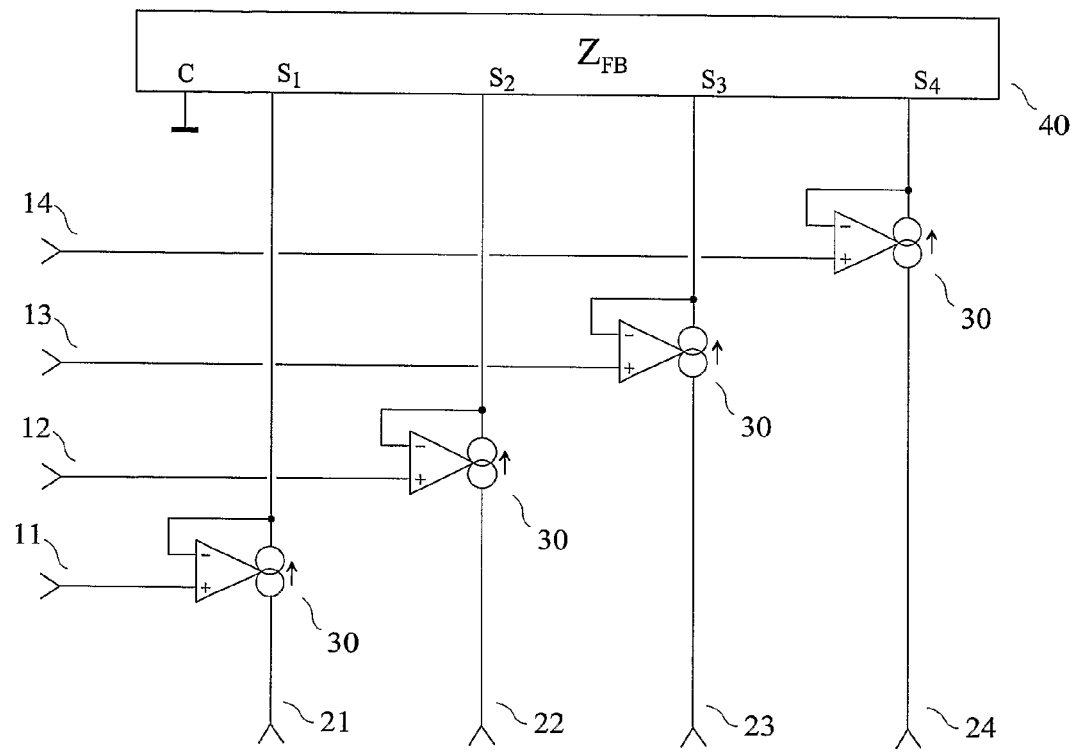
FIG. 5 shows a fourth embodiment of the invention, for n=4.

A multiple-input and multiple-output amplifier of the invention is represented in FIG. 5. It comprises 4 signal input terminals (11) (12) (13) (14), 4 signal output terminals (21) (22) (23) (24), 4 active sub-circuits (30) as shown in FIG. 4, having the same transconductance g, and a feedback network (40). Using equation (9) or equation (18), we find that the transfer admittance matrix of this multiple-input and multiple-output amplifier is $$Y_T = \left(\frac{1}{g} 1_n + Z_{FB}\right)^{-1} \qquad (22)$$

The output admittance matrix of the multiple-input and multiple-output amplifier is of course given by equation (10). If g is sufficiently large, equation (22) tells us that the transfer admittance matrix becomes equal to the inverse of the impedance matrix $Z_{FB}$. From a design standpoint, g should be either well-controlled and stable, or sufficiently large.

The person skilled in the art knows how to design circuits having a behavior very similar to that of the voltage-controlled current source (34). There are many possible schematic diagrams, depending mainly on the desired accuracy and on the operating frequency band.

According to the invention, the multiple-input and multiple-output amplifier may be such that at least one of the active sub-circuits behaves approximately, in the known frequency band, as a voltage-controlled current source having its negative input terminal connected to its positive output terminal.

We note that in the active sub-circuits discussed above implementing an ideal CCII or a voltage-controlled current source, there is no current flowing on the sub-circuit input terminals.

According to the invention, the multiple-input and multiple-output amplifier may be such that, in each active sub-circuit, the absolute value of the current flowing into the sub-circuit input terminal is much smaller than the absolute value of the current flowing out of the sub-circuit common terminal.

Figure 6:
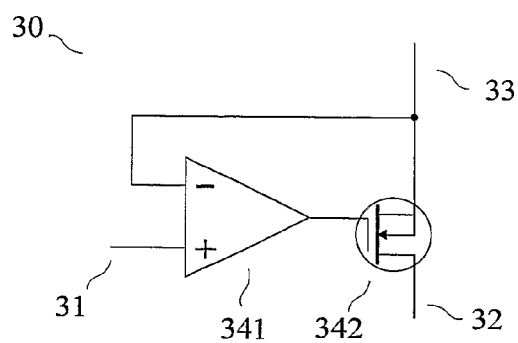
FIG. 6 shows an active sub-circuit made of a voltage-mode operational amplifier and a MOSFET, used in the fourth embodiment.

FIG. 6 shows a well-known schematic diagram for implementing the principle shown in FIG. 4, with a large value of the transconductance g at sufficiently low frequencies. The active sub-circuit (30) shown in FIG. 6 is adequate for unipolar operation and requires a suitable biasing at the sub-circuit output terminal (32). The sub-circuit input terminal (31) is connected to the positive input terminal of an operational amplifier (341) having its output connected to the gate of a MOSFET (342), the sub-circuit output terminal (32) is connected to the drain of the MOSFET (342), and the sub-circuit common terminal (33) is connected to the negative input terminal of the operational amplifier (341) and to the source of the MOSFET (342). Equations (22) and (10) are adequate to estimate the transfer admittance matrix and the output admittance matrix of a multiple-input and multiple-output amplifier implementing this type of active sub-circuit, at sufficiently low frequencies.

Fifth Embodiment

The fifth embodiment of a device of the invention, given by way of non-limiting example, also corresponds to the multiple-input and multiple-output amplifier of the invention represented in FIG. 1, and all explanations provided for the first embodiment are applicable to this fifth embodiment. In this fifth embodiment, each active sub-circuit has only three terminals. Consequently, concerning an active sub-circuit j, we note:

a) that, referring to FIG. 3, the current $i_{CAj}$ flowing out of the sub-circuit common terminal (33) is equal to the sum of the current $i_{IAj}$ flowing into the sub-circuit input terminal (31) and the current $i_{OAj}$ flowing into the sub-circuit output terminal (32), b) that voltages applied simultaneously to the three terminals (31) (32) (33) have no effect on the currents, c) that, at a given frequency, the small-signal behavior of the active sub-circuit j (30) is conveniently described by the admittance matrix $Y_{TPj}$ of the two-port with respect to the sub-circuit common terminal, defined by $$\begin{pmatrix} i_{IAj} \\ i_{OAj} \end{pmatrix} = Y_{TPj} \begin{pmatrix} e_j - w_j \\ v_j - w_j \end{pmatrix} \quad (23)$$

where $$Y_{TPj} = \begin{pmatrix} y_{11j} & y_{12j} \\ y_{21j} & y_{22j} \end{pmatrix} \quad (24)$$

Consequently, we have $$Y_{Aj} = \begin{pmatrix} y_{11j} & -y_{11j} - y_{12j} & y_{12j} \\ y_{11j} + y_{21j} & -y_{11j} - y_{12j} - y_{21j} - y_{22j} & y_{12j} + y_{22j} \\ y_{21j} & -y_{21j} - y_{22j} & y_{22j} \end{pmatrix} \quad (25)$$

and $$\begin{cases} y_{IAj} = y_{11j} \\ y_{CMIAj} = 0 \\ y_{IRAj} = y_{12j} \end{cases} \begin{cases} y_{CTAj} = y_{11j} + y_{21j} \\ y_{CMCAj} = 0 \\ y_{CRAj} = y_{12j} + y_{22j} \end{cases} \begin{cases} y_{OTAj} = y_{21j} \\ y_{CMOAj} = 0 \\ y_{OAj} = y_{22j} \end{cases} \quad (26)$$

We note that implementations of the active sub-circuits of the third and fourth embodiments typically comprise one or more connection to sources of electrical power, possibly including a connection to the reference terminal. For instance, in FIG. 6, the operational amplifier (341) will typically have two power supply terminals, which could for instance be connected to the reference terminal and to a +10 V rail respectively (though such connections are not shown in FIG. 6). Such implementations are not possible in this fifth embodiment, since no separate power-supply connection is possible.

Figure 7:
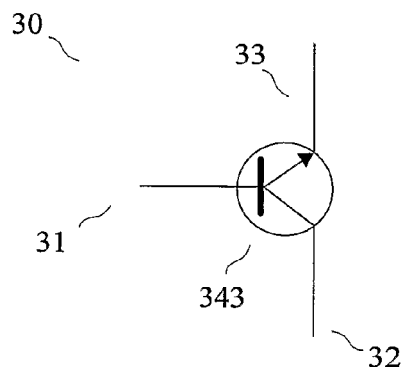
FIG. 7 shows an active sub-circuit made of a bipolar transistor, used in the fifth and sixth embodiments.

However, this fifth embodiment may use active sub-circuits each comprising a single active circuit element, for instance a bipolar transistor or a MOSFET. This fifth embodiment could for instance use the active sub-circuit (30) shown in FIG. 7, comprising only a bipolar transistor (343). With a suitable biasing at the sub-circuit input terminal (31) and at the sub-circuit output terminal (32), provided by external circuits, this active sub-circuit may be adequate for unipolar operation. The sub-circuit input terminal (31) is connected to the base of the bipolar transistor (343), the sub-circuit output terminal (32) is connected to the collector of this transistor (343), and the sub-circuit common terminal (33) is connected to the emitter of this transistor (343). We note that, when using a bipolar transistor as shown in FIG. 7 or a MOSFET (with the sub-circuit input terminal connected to the gate, the sub-circuit output terminal connected to the drain, and the sub-circuit common terminal connected to the source), the current flowing out of the sub-circuit common terminal and the current flowing into the sub-circuit output terminal may be considered as practically only depending on the voltage between the sub-circuit input terminal and the sub-circuit common terminal.

At dc and low frequencies, such implementations comprising a single active circuit element are likely to be less accurate and less linear than implementations comprising an operational amplifier, but they can be designed to operate at much higher frequencies. We note that equation (20) indicates that the negative feedback reduces the voltages $e_j - w_j$ seen by the active sub-circuits, thereby improving linearity.

Sixth Embodiment

The sixth embodiment of a device of the invention, given by way of non-limiting example, also corresponds to the multiple-input and multiple-output amplifier of the invention represented in FIG. 1, and all explanations provided for the first embodiment are applicable to this sixth embodiment. Additionally, in this sixth embodiment, all active sub-circuit have substantially identical properties and each active sub-circuit has only three terminals. Consequently, the explanations given above for the second embodiment and for the fifth embodiment are applicable. In this sixth embodiment, the equation (24) may therefore be written $$Y_{TPj} = \begin{pmatrix} y_{11} & y_{12} \\ y_{21} & y_{22} \end{pmatrix} \quad (27)$$

Using equations (18), (19) and (26), we obtain $$Y_T = [y_{21}1_n - \{y_{22}y_{11} - y_{12}y_{21}\}Z_{FB}][1_n + (y_{11} + y_{12} + y_{21} + y_{22})Z_{FB}]^{-1} \quad (28)$$

and $$Y_O = [y_{22}1_n + \{y_{11}y_{22} - y_{12}y_{21}\}Z_{FB}][1_n + (y_{11} + y_{12} + y_{21} + y_{22})Z_{FB}]^{-1} \quad (29)$$

Let us again consider the active sub-circuit (30) shown in FIG. 7, comprising only a bipolar transistor (343) and let us assume that the bipolar transistor is adequately described with a small-signal forward current transfer ratio $h_{21} = h_{21e}$ and a small signal input impedance $h_{11} = h_{11e}$ (i.e. we neglect the reverse voltage transfer ratio $h_{12e}$ and the output admittance $h_{22e}$). In this case, the transfer admittance matrix of a multiple-input and multiple-output amplifier of the invention implementing such identical active sub-circuits is $$Y_T \approx \left( \frac{h_{11}}{h_{21}} 1_n + \frac{h_{21}+1}{h_{21}} Z_{FB} \right)^{-1} = \left( \frac{1}{y_{21}} 1_n + \frac{y_{21}+y_{11}}{y_{21}} Z_{FB} \right)^{-1} \quad (30)$$

If the absolute values of $h_{21e}$ and of the ratio $h_{21e}/h_{11e}$ are sufficiently large, equation (30) tells us that the transfer admittance matrix becomes practically equal to the inverse of the impedance matrix $Z_{FB}$. At low frequencies, this multiple-input and multiple-output amplifier will provide a lower accuracy than another one using the active sub-circuits shown in FIG. 6. However, if the impedance matrix of the load connected to the signal output terminals of the multiple-input and multiple-output amplifier for which equation (30) was obtained is such that the output voltages are low, this multiple-input and multiple-output amplifier could operate at frequencies exceeding 10 GHz, since bipolar transistors with suitable characteristics are available.

Figure 8:
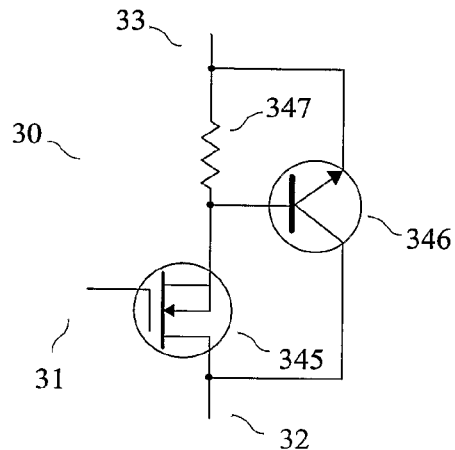
FIG. 8 shows an active sub-circuit made of a MOSFET and a bipolar transistor used in the sixth embodiment.

This sixth embodiment may also for instance use active sub-circuits each comprising a transistor pair arranged as shown in FIG. 8, comprising a MOSFET (345), a bipolar transistor (346) and a resistor (347). With a suitable biasing at the sub-circuit input terminal (31) and at the sub-circuit output terminal (32), provided by external circuits, this active sub-circuit may be adequate for unipolar operation. The sub-circuit input terminal (31) is connected to the gate of the MOSFET (345), the sub-circuit output terminal (32) is connected to the drain of the MOSFET (345) and to the collector of the bipolar transistor (346), and the sub-circuit common terminal (33) is connected to the emitter of the bipolar transistor (346). The base of the bipolar transistor (346) is connected to the source of the MOSFET (345), the resistor (347) being connected between the base and the emitter of the bipolar transistor (346), this scheme providing an active load delivering a roughly constant current to the source of the MOSFET. Since the MOSFET behaves as a voltage follower, the transfer admittance matrix of the multiple-input and multiple-output amplifier can be roughly assessed as if only the bipolar transistor was present, as in FIG. 7. However, the absolute values of the currents $i_{IAj}$ shown in FIG. 3 will be much smaller than with the active sub-circuits shown in FIG. 7.

Equation (30) is not fully satisfactory to investigate the limitations of a multiple-input and multiple-output amplifier using the active sub-circuits shown in FIG. 7, especially at higher frequencies. In equations (28) and (29), we can for instance replace the admittance matrix of the two-port with its hybrid matrix. We obtain $$Y_T = [h_{21}1_n - h_{22}Z_{FB}]/[h_{11}1_n + ([1 - h_{12}][1 + h_{21}] + h_{11}h_{22})Z_{FB}]^{-1} \quad (31)$$

and $$Y_O = [(h_{11}h_{22} - h_{12} - h_{21})1_n + h_{22}Z_{FB}]/[h_{11}1_n + ([1 - h_{12}][1 + h_{21}] + h_{11}h_{22})Z_{FB}]^{-1} \quad (32)$$

Clearly, reducing the reverse voltage transfer ratio $h_{12}$ and the output admittance $h_{22}$ will make the difference between the transfer admittance matrix $Y_T$ and said given admittance matrix $Y_G$ less sensitive to the variations of $h_{21}$ caused by variations of temperature and/or frequency. Reducing the reverse voltage transfer ratio $h_{12}$ also makes the output admittance matrix $Y_O$ less sensitive to the variations of $h_{21}$ caused by variations of temperature and/or frequency.

Seventh Embodiment

The seventh embodiment of a device of the invention, given by way of non-limiting example, also corresponds to the multiple-input and multiple-output amplifier of the invention represented in FIG. 1, and all explanations provided for the first embodiment are applicable to this seventh embodiment. Additionally, in this seventh embodiment, all active sub-circuit have substantially identical properties (consequently, the explanations given for the second embodiment are applicable) and each active sub-circuit corresponds to the schematic diagram shown in FIG. 9.

Figure 9:
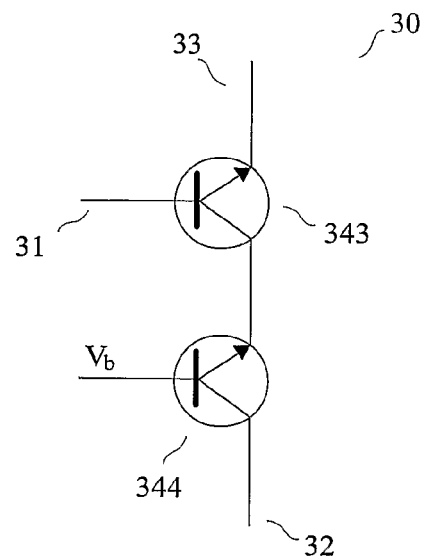
FIG. 9 shows an active sub-circuit made of a cascode circuit comprising two bipolar transistors, used in the seventh embodiment.

In FIG. 9, the active sub-circuit (30) comprises a first bipolar transistor (343) and a second bipolar transistor (344) in a cascode configuration. Used with external circuits providing a suitable biasing at the sub-circuit input terminal (31), at the sub-circuit output terminal (32) and at the base of the second bipolar transistor (344), this active sub-circuit may be adequate for unipolar operation. The sub-circuit input terminal (31) is connected to the base of the first bipolar transistor (343), the sub-circuit output terminal (32) is connected to the collector of the second bipolar transistor (344), and the sub-circuit common terminal (33) is connected to the emitter of the first bipolar transistor (343).

Since the active sub-circuit (30) shown in FIG. 9 has four terminals if we include the terminal needed to apply the biasing at the base of the second bipolar transistor (344), the results provided in the discussion of the sixth embodiment are not strictly applicable. However, if we consider that the variations of the current flowing into the base of the second bipolar transistor (344) are small compared to the variations of the collector currents, we can in practice use the equations (28) to (32). The main advantage of the cascode configuration used in FIG. 9 is that the parameters $h_{12}$ and $y_{12}$ have a much smaller absolute value than with a single transistor, thereby increasing the bandwidth and reducing the influence of temperature and frequency on the output admittance matrix $Y_O$ and on the difference between the transfer admittance matrix $Y_T$ and said given admittance matrix $Y_G$.

We note that a multiple-input and multiple-output amplifier of the invention may be considered as a collection of n series-series feedback amplifiers with one input and one output (we use the definition of a series-series feedback amplifier presented in chapter 25 of the above-mentioned book *The Circuits and Filters Handbook*), each initially comprising a grounded passive linear two-terminal circuit element in its series-series feedback network, collection in which the n grounded passive linear two-terminal circuit elements have been replaced with a single feedback network having a grounded terminal and n other terminals, this feedback network presenting, in the known frequency band, a non-diagonal impedance matrix (defined with respect to ground). Consequently, the person skilled in the art understands that any series-series feedback amplifier with one input and one output, comprising at least one grounded passive linear two-terminal circuit element in its series-series feedback network, may be modified to become a suitable active sub-circuit. The modification consists in removing a grounded passive linear two-terminal circuit element from the series-series feedback network, the node, other than ground, where this grounded passive linear two-terminal circuit element was connected becoming the sub-circuit common terminal. This modification can be carried out on all known types of series-series feedback amplifiers with one input and one output, comprising at least one grounded passive linear two-terminal circuit element in their series-series feedback network, for instance the series-series feedback amplifiers described in the chapter 25 of the above-mentioned book *The Circuits and Filters Handbook*.

Eighth Embodiment

The eighth embodiment of a device of the invention, given by way of non-limiting example, also corresponds to the multiple-input and multiple-output amplifier of the invention represented in FIG. 1, and all explanations provided for the first embodiment are applicable to this eighth embodiment. Additionally, in this eighth embodiment, the multiple-input and multiple-output amplifier is such that each active sub-circuit comprises an internal feedback loop, so as to obtain an output admittance matrix $Y_O$ of the multiple-input and multiple-output amplifier approximating a wanted matrix $Y_W$.

Figure 10:
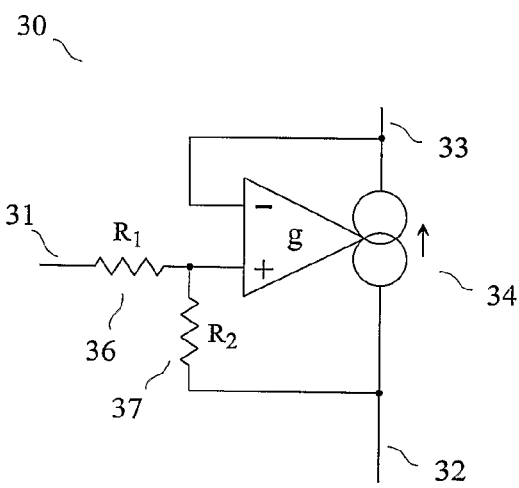
FIG. 10 shows an active sub-circuit in which an internal feedback loop is created using a resistor, used in the eighth embodiment.

This eighth embodiment may for instance use the active sub-circuit j (30) shown in FIG. 10, made of a voltage-controlled current source (34) of transconductance g having its negative input terminal connected to its positive output terminal, a first resistor (36) having the resistance $R_1$ and a second resistor (37) having the resistance $R_2$. The sub-circuit input terminal (31) is connected to a terminal of the first resistor (36), the other terminal of this resistor being connected to the positive input terminal of the voltage-controlled current source (34). The sub-circuit output terminal (32) is connected to the negative output terminal of the voltage-controlled current source (34) and to a terminal of the second resistor (37), the other terminal of this resistor being connected to the positive input terminal of the voltage-controlled current source (34). The sub-circuit common terminal (33) is connected to the negative input and positive output terminals of the voltage-controlled current source (34). We note that the second resistor (37) creates an internal feedback loop and is connected in such a way that a shunt-shunt feedback is obtained (we use the definition of a shunt-shunt feedback presented in chapter 25 of the above-mentioned book entitled *The Circuits and Filters Handbook*), which produces $$Y_{Aj} = \frac{1}{R_1+R_2}\begin{pmatrix} 1 & 0 & -1 \\ gR_2 & -g(R_1+R_2) & gR_1 \\ gR_2-1 & -g(R_1+R_2) & gR_1+1 \end{pmatrix} \quad (33)$$

and $$\begin{cases} y_{IAj} = \frac{1}{R_1+R_2} \\ y_{CMIAj} = 0 \\ y_{IRAj} = \frac{-1}{R_1+R_2} \end{cases} \begin{cases} y_{CTAj} = \frac{gR_2}{R_1+R_2} \\ y_{CMCAj} = 0 \\ y_{CRAj} = \frac{gR_1}{R_1+R_2} \end{cases} \begin{cases} y_{OTAj} = \frac{gR_2-1}{R_1+R_2} \\ y_{CMOAj} = 0 \\ y_{OAj} = \frac{gR_1+1}{R_1+R_2} \end{cases} \quad (34)$$

Figure 11:
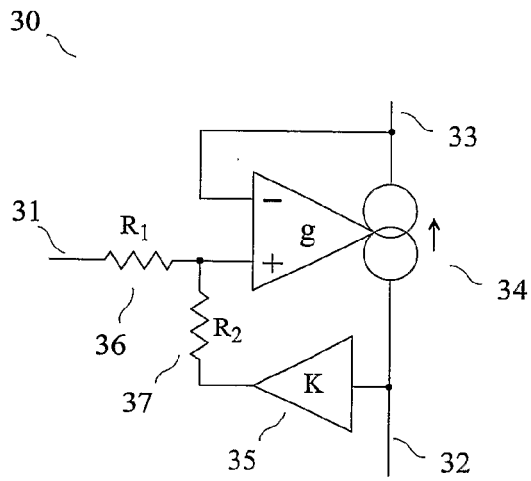
FIG. 11 shows an active sub-circuit in which an internal feedback loop comprises a voltage amplifier, used in the eighth embodiment.

This eighth embodiment could also for instance use the active sub-circuit j (30) shown in FIG. 11, made of a voltage-controlled current source (34) of transconductance g having its negative input terminal connected to its positive output terminal, a voltage amplifier (35) of voltage gain K having a very large input impedance and a very small output impedance, a first resistor (36) having the resistance $R_1$ and a second resistor (37) having the resistance $R_2$. The sub-circuit input terminal (31) is connected to a terminal of the first resistor (36), the other terminal of this resistor being connected to the positive input terminal of the voltage-controlled current source (34). The sub-circuit output terminal (32) is connected to the negative output terminal of the voltage-controlled current source (34) and to the input of the voltage amplifier (35). The output of the voltage amplifier (35) is connected to a terminal of the second resistor (37), the other terminal of this resistor being connected to the positive input terminal of the voltage-controlled current source (34). The sub-circuit common terminal (33) is connected to the negative input and positive output terminals of the voltage-controlled current source (34). We note that the voltage amplifier (35) and the second resistor (37) create an internal feedback loop and are connected in such a way that a shunt-shunt feedback is obtained, which produces $$Y_{Aj} = \frac{1}{R_1+R_2}\begin{pmatrix} 1 & 0 & -K \\ gR_2 & -g(KR_1+R_2) & gKR_1 \\ gR_2 & -g(KR_1+R_2) & gKR_1+1 \end{pmatrix} \quad (35)$$

and $$\begin{cases} y_{IAj} = \frac{1}{R_1+R_2} \\ y_{CMIAj} = \frac{1-K}{R_1+R_2} \\ y_{IRAj} = \frac{-K}{R_1+R_2} \end{cases} \begin{cases} y_{CTAj} = \frac{gR_2}{R_1+R_2} \\ y_{CMCAj} = 0 \\ y_{CRAj} = \frac{gKR_1}{R_1+R_2} \end{cases} \begin{cases} y_{OTAj} = \frac{gR_2}{R_1+R_2} \\ y_{CMOAj} = 0 \\ y_{OAj} = \frac{gKR_1}{R_1+R_2} \end{cases} \quad (36)$$

In the special case of a multiple-input and multiple-output amplifier in which all active sub-circuits are practically identical to the one shown in FIG. 10, using equations (18), (19) and (34), we obtain $$Y_T = \left[\frac{gR_2-1}{R_1+R_2}1_n - \frac{g}{R_1+R_2}Z_{FB}\right][1_n+gZ_{FB}]^{-1} \quad (37)$$

$$Y_O = \left[\frac{gR_1+1}{R_1+R_2}1_n + \frac{g}{R_1+R_2}Z_{FB}\right][1_n+gZ_{FB}]^{-1} \quad (38)$$

Since we want that $Y_T$ approximates $Y_G$, this special case is appropriate when $Y_W$ is in the form $$Y_W \approx \left[\left(R_1 + \frac{1}{g}\right)1_n + Z_{FB}\right]\left[\left(R_2 - \frac{1}{g}\right)1_n - Z_{FB}\right]^{-1} Y_G \quad (39)$$

In the special case of a multiple-input and multiple-output amplifier in which all active sub-circuits are substantially identical to the one shown in FIG. 11, using equations (18), (19) and (36), we obtain $$Y_T = \frac{gR_2}{R_1 + R_2}\left[1_n + g\frac{KR_1 + R_2}{R_1 + R_2} Z_{FB}\right]^{-1} \quad (40)$$

$$Y_O = \frac{gKR_1}{R_1 + R_2}\left[1_n + g\frac{KR_1 + R_2}{R_1 + R_2} Z_{FB}\right]^{-1} \quad (41)$$

Since we want that $Y_T$ approximates $Y_G$, this special case is appropriate when $Y_W$ is in the form $$Y_W \approx K\frac{R_1}{R_2} Y_G \quad (42)$$

Consequently, according to the invention, the multiple-input and multiple-output amplifier may be such that said given admittance matrix $Y_G$ approximates the product of a scalar $\lambda$ by said wanted matrix $Y_W$. This result can be obtained when an internal feedback loop is arranged in each active sub-circuit, as shown in FIG. 11. The scalar $\lambda$ could be a real number, as in the case of equation (42). However, we note that the resistors (36) and (37) of FIG. 11 could each be replaced with a linear two-terminal circuit element having a frequency-dependent impedance. Consequently, according to the invention, said scalar $\lambda$ is a real number or a complex number possibly depending on frequency.

Whenever $Y_G$ approximates the product of a scalar $\lambda$ by $Y_W$, we have:

$$Y_T \approx \lambda Y_O \quad (43)$$

In this case, let us consider the circumstance in which the n signal output terminals are connected to a load presenting, at a given frequency, an admittance matrix approximating $\mu Y_O$, where $\mu$ is a real or complex scalar different from −1. The column-vector I of the output currents is therefore $$I \approx -\mu Y_O V \quad (44)$$

Using equation (1), we obtain $$V \approx \frac{-\lambda}{1 + \mu} E \quad (45)$$

In other words, we observe that the column-vector V of the output voltages is in this case proportional to the column-vector E of the input voltages. This property is interesting and difficult to obtain with other means, since floating voltage-controlled voltage sources are difficult to design, especially when a bandwidth exceeding 100 kHz is needed. A multiple-input and multiple-output amplifier of the invention comprising active sub-circuits implementing the shunt-shunt feedback shown in FIG. 11 may provide a much wider bandwidth. However, the fact that, in the shunt-shunt feedback loop shown in FIG. 11, at least two active components providing gain are connected in cascade, adversely affects the achievable bandwidth. This is because the addition of the voltage amplifier (35) is likely to make an additional compensation necessary to obtain an appropriate phase margin, especially when the load connected to the signal output terminals of the multiple-input and multiple-output amplifier may be such that high voltage gains are obtained.

Equation (39) shows that, if $R_1$ and $R_2$ are sufficiently large, a multiple-input and multiple-output amplifier of the invention implementing the active sub-circuit shown in FIG. 10 could be such that $Y_G$ approximates the product of a scalar by $Y_W$. However, specialists understand that such large resistance values are not appropriate when a wide bandwidth is needed.

In FIG. 10, the voltage-controlled current source (34) could be replaced with a CCII−. However, in FIG. 10, it is not possible to replace the voltage-controlled current source (34) with a CCII+ because the feedback loop would create a positive feedback. In FIG. 11, the voltage-controlled current source (34) could be replaced with a CCII− or with a CCII+, if an appropriate voltage gain K is used (for instance K=+1 for a CCII−, or K=−1 for a CCII+).

Ninth Embodiment

The ninth embodiment of a device of the invention, given by way of non-limiting example, also corresponds to the multiple-input and multiple-output amplifier of the invention represented in FIG. 1, and all explanations provided for the first embodiment are applicable to this ninth embodiment. In this ninth embodiment, all active sub-circuit have substantially identical properties, and the multiple-input and multiple-output amplifier is such that the output admittance matrix $Y_O$ approximates a wanted matrix $Y_W$, and that said given admittance matrix $Y_G$ approximates the product of a scalar A by the wanted matrix $Y_W$, the scalar A being possibly frequency-dependent. Additionally, this ninth embodiment comprises active sub-circuits implementing the principle of the active sub-circuit (30) shown in FIG. 12, made of a first voltage-controlled current source (34) of transconductance $g_1$ having its negative input terminal connected to its positive output terminal, a second voltage-controlled current source (38) of transconductance $g_2$ having its negative input terminal connected to its positive output terminal, a first resistor (36) having the resistance $R_1$ and a second resistor (37) having the resistance $R_2$. The sub-circuit input terminal (31) is connected to the positive input terminal of the second voltage-controlled current source (38) and to a terminal of the first resistor (36), the other terminal of this resistor being connected to the positive input terminal of the first voltage-controlled current source (34). The sub-circuit output terminal (32) is connected to the negative output terminal of the first voltage-controlled current source (34), to the negative output terminal of the second voltage-controlled current source (38) and to a terminal of the second resistor (37), the other terminal of this resistor being connected to the positive input terminal of the first voltage-controlled current source (34). The sub-circuit common terminal (33) is connected to the negative input and positive output terminals of the first voltage-controlled current source (34). The negative input and positive output terminals of the second voltage-controlled current source (38) are connected to the reference terminal. This active sub-circuit j is such that $$Y_{Aj} = \frac{1}{R_1 + R_2} \begin{pmatrix} 1 & 0 & -1 \\ g_1 R_2 & -g_1(R_1 + R_2) & g_1 R_1 \\ g_1 R_2 - 1 + g_2(R_1 + R_2) & -g_1(R_1 + R_2) & g_1 R_1 + 1 \end{pmatrix} \quad (46)$$

and $$\begin{cases} y_{IAj} = \frac{1}{R_1 + R_2} \\ y_{CMIAj} = 0 \\ y_{IRAj} = \frac{-1}{R_1 + R_2} \end{cases} \begin{cases} y_{CTAj} = \frac{g_1 R_2}{R_1 + R_2} \\ y_{CMCAj} = 0 \\ y_{CRAj} = \frac{g_1 R_1}{R_1 + R_2} \end{cases} \begin{cases} y_{OTAj} = \frac{g_1 R_2 - 1}{R_1 + R_2} + \frac{2g_2}{3} \\ y_{CMOAj} = \frac{g_2}{3} \\ y_{OAj} = \frac{g_1 R_1 + 1}{R_1 + R_2} - \frac{g_2}{3} \end{cases} \quad (47)$$

Using equations (18), (19) and (47), we obtain $$Y_T = \left[ \left( \frac{g_1 R_2 - 1}{R_1 + R_2} + g_2 \right) 1_n + g_1 \left( g_2 - \frac{1}{R_1 + R_2} \right) Z_{FB} \right] [1_n + g_1 Z_{FB}]^{-1} \quad (48)$$

and $$Y_O = \left[ \frac{g_1 R_1 + 1}{R_1 + R_2} 1_n + \frac{g_1}{R_1 + R_2} Z_{FB} \right] [1_n + g_1 Z_{FB}]^{-1} \quad (49)$$

For the particular case in which $g_2 = 1/R_1$, we obtain $$Y_T \approx \frac{R_2}{R_1} Y_O \quad (50)$$

Figure 12:
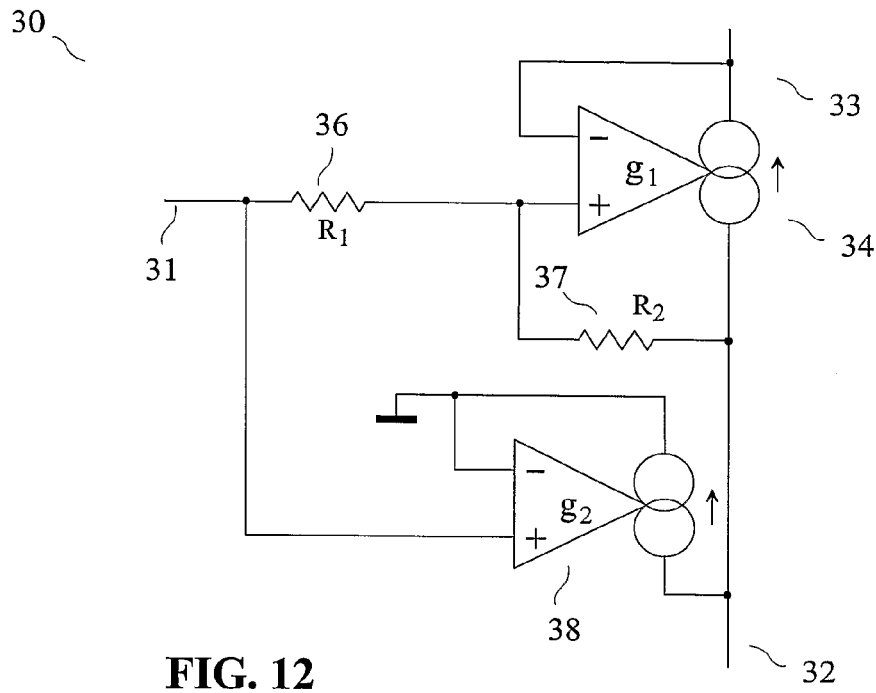
FIG. 12 shows an active sub-circuit comprising an internal feedback loop and a second voltage-controlled current source, used in the ninth embodiment.
Figure 13:
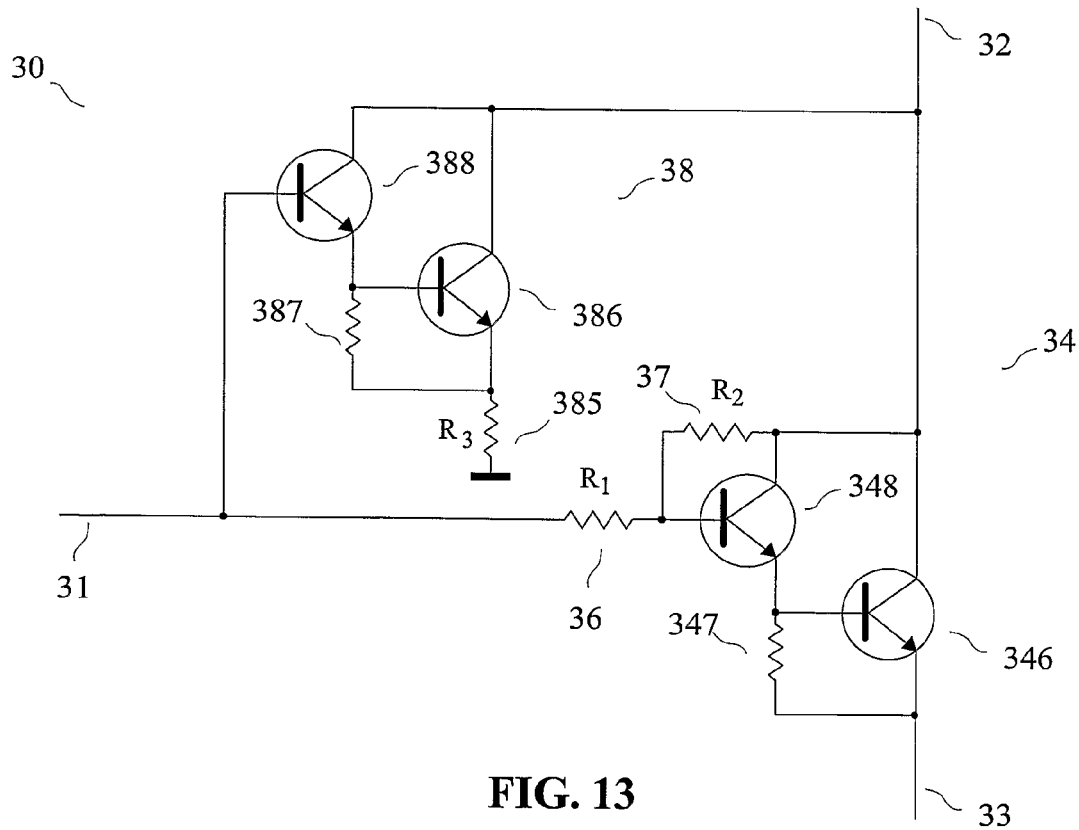
FIG. 13 shows an active sub-circuit according to the principle of FIG. 12, comprising four bipolar transistors, used in the ninth embodiment.

Since we want that $Y_T$ approximates $Y_G$, and that $Y_O$ approximates $Y_W$, this particular case is adequate when $$Y_W \approx \frac{R_1}{R_2} Y_G \quad (51)$$

which precisely corresponds to a requirement of this ninth embodiment. Contrary to the approach followed in the eighth embodiment, this result is obtained without using at least two active components providing gain connected in cascade in a feedback loop. Consequently, the bandwidth which can be obtained using active sub-circuits implementing the principle of the active sub-circuit (30) shown in FIG. 12 is much wider. For instance, the active sub-circuit shown in FIG. 13 is adequate for unipolar operation when a suitable biasing at the sub-circuit input terminal (31) and at the sub-circuit output terminal (32) is provided by external circuits. In FIG. 13, the first voltage-controlled current source having its negative input terminal connected to its positive output terminal in FIG. 12 is replaced by a transistor pair (34) comprising a first bipolar transistor (348), a second bipolar transistor (346) and a resistor (347). This transistor pair (34) provides a large transadmittance. In FIG. 13, the second voltage-controlled current source having its negative input terminal connected to its positive output terminal in FIG. 12 is replaced by a controlled current source (38) comprising a first bipolar transistor (388), a second bipolar transistor (386), a first resistor (387) and a second resistor (385) having the resistance $R_3$. The transadmittance of the controlled current source (38) approximates $1/R_3$. In FIG. 13, the transistor pair (34), the controlled current source (38), the first resistor (36) having the resistance $R_1$ and the second resistor (37) having the resistance $R_2$ are arranged in order to implement the principle shown in FIG. 12.

The resistance $R_1$ is substantially equal to the resistance $R_3$. Consequently, a multiple-input and multiple-output amplifier of the invention in which all active sub-circuits are substantially identical to the one shown in FIG. 13 may roughly provide $$Y_T \approx \frac{R_2}{R_1(R_1 + R_2)} (R_1 Z_{FB}^{-1} + 1_n) \quad (52)$$

and $$Y_O \approx \frac{1}{R_1 + R_2} (R_1 Z_{FB}^{-1} + 1_n) \quad (53)$$

The specialist understands that equations (52) and (53) are approximations which become invalid at higher frequencies. However equations (17) to (19) could be used to more accurately compute the characteristics of such a multiple-input and multiple-output amplifier of the invention, and also to optimize its performances with an appropriate selection of components.

We note that the resistors (36) and (37) of FIG. 12 and FIG. 13 could each be replaced with a linear two-terminal circuit element having a frequency-dependent impedance. Consequently, according to the invention, said scalar λ could be a frequency-dependent complex number. Using linear two-terminal circuit elements having a frequency-dependent impedance in the place of the resistors (36) and (37) of FIG. 12 and FIG. 13 could for instance be useful to introduce a compensation, which might be necessary when the load connected to the signal output terminals of the multiple-input and multiple-output amplifier may be such that high voltage gains are obtained and/or such that it is strongly reactive.

Figure 14:
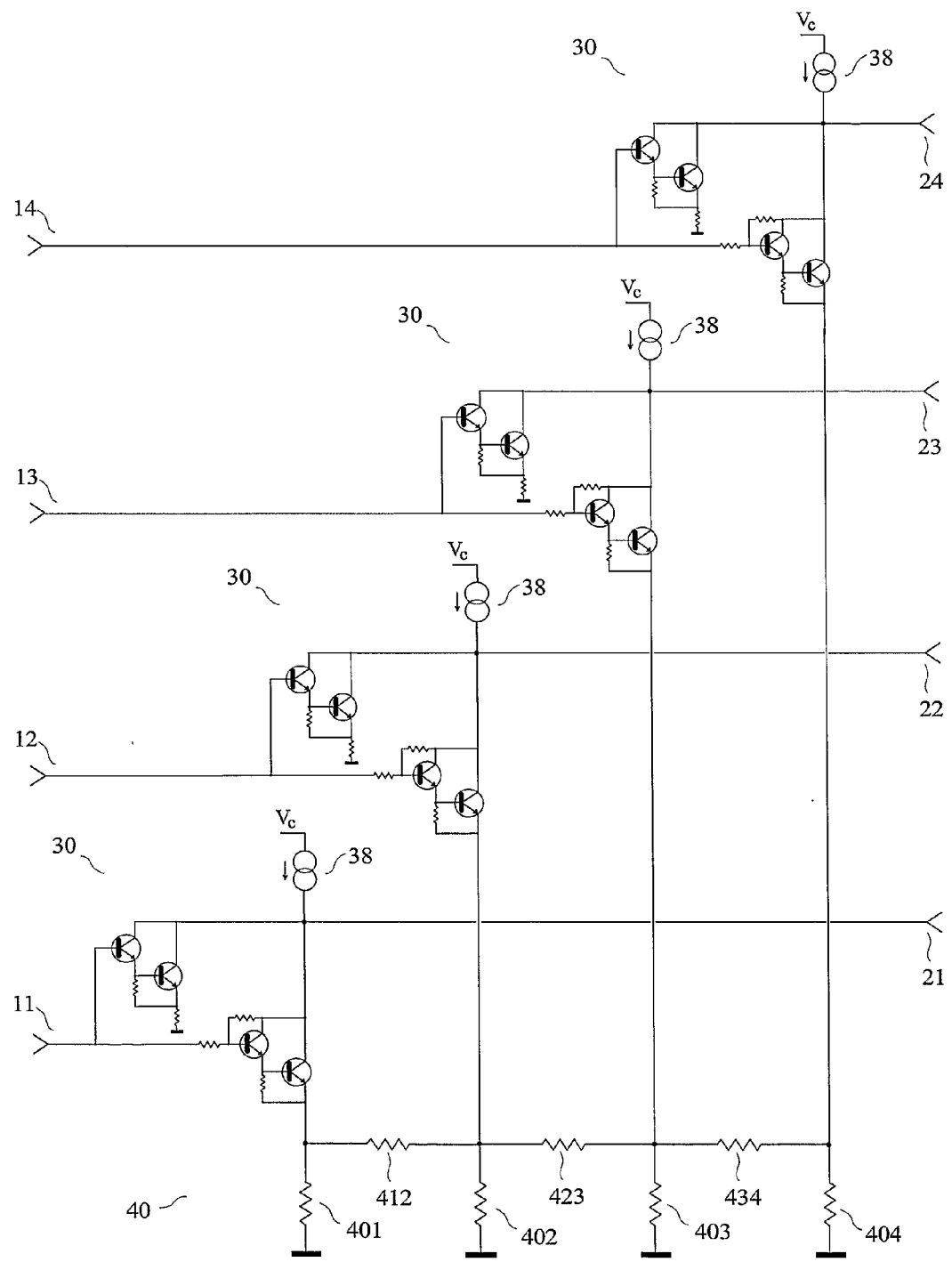
FIG. 14 shows a ninth embodiment of the invention, comprising four active sub-circuits of FIG. 13.

A multiple-input and multiple-output amplifier of the invention is represented in FIG. 14. It comprises 4 signal input terminals (11) (12) (13) (14), 4 signal output terminals (21) (22) (23) (24), 4 active sub-circuits (30) as shown in FIG. 13 and a feedback network (40) made of four resistors (401) (402) (403) (404) connected to the reference terminal and three other resistors (412) (423) (434) providing a non-diagonal impedance matrix. Four current sources (38) provide the biasing of the sub-circuit output terminals. An appropriate biasing of the signal input terminals (11) (12) (13) (14) must be provided by external circuits.

We note that, in FIG. 12, the two voltage-controlled current sources (34) (38) could each be replaced with a CCII–.

We note that in FIG. 14 (and also in FIG. 2), the feedback network comprises only resistors. However, the specialist understands that, in order to obtain that said transfer admittance matrix better approximates said given admittance matrix, it may be desirable to adjust said non-diagonal impedance matrix, using components presenting an adjustable impedance. Such components may be adjustable by electrical means, such as a MOSFET used in the ohmic regime providing a variable resistance, or such as a variable capacitance diode providing a variable capacitance. Consequently, according to the invention, said feedback network may be such that said non-diagonal impedance matrix can be adjusted by electrical means.

INDICATIONS ON INDUSTRIAL APPLICATIONS

The invention is suitable for applications in which multiple-input and multiple-output transadmittance amplifiers providing, in a known frequency band, a transfer admittance matrix approximating a given admittance matrix $Y_G$ are needed, this given admittance matrix being a non-diagonal and invertible n×n matrix. We have seen above that, for some implementations, this matrix $Y_G$ must approximate a symmetrical matrix. Consequently, the invention is particularly suitable as a device providing n linear combinations of n signals, defined by such a square matrix.

Since the characteristic impedance matrix of a multiconductor transmission line is necessarily invertible and symmetrical, multiple-input and multiple-output amplifiers of the invention can be used for implementing the French patent application number 0303087 of 13 Mar. 2003, entitled "Procédé et dispositif pour la transmission sans diaphonie", corresponding to the international application number PCT/EP2004/002383 of 18 Feb. 2004, entitled "Method and device for transmission without crosstalk", for instance in devices implementing the equation (5) or the equation (11) of these applications. In the case where a multiple-input and multiple-output amplifier of the invention is used at an end of the interconnection to provide the linear combinations defined by the equation (5) of these applications, it can also provide an output impedance matrix approximating the characteristic impedance matrix of the multiconductor transmission line, thereby simultaneously performing the functions of a transmitting circuit and of a termination circuit. We note that these applications precisely mention that the device for transmission without crosstalk could be such that the termination circuits and the transmitting circuit are not without a part or parts in common to any two of them.

The specialist understands that a combined multiple-input and multiple-output amplifier having m signal input terminals and n signal output terminals may comprise:
  a multiple-input and multiple-output voltage-mode amplifier having m signal input terminals and n signal output terminals, providing, in a known frequency band, a n×m voltage gain matrix $G_V$, the signal inputs terminals of the combined multiple-input and multiple-output amplifier being connected to the signal input terminals of the multiple-input and multiple-output voltage-mode amplifier;
  a multiple-input and multiple-output amplifier of the invention having n signal input terminals and n signal output terminals, providing, in the known frequency band, a transfer admittance matrix approximating a given admittance matrix $Y_G$, this given admittance matrix being a non-diagonal and invertible n×n matrix, the signal output terminals of the multiple-input and multiple-output voltage-mode amplifier being connected to the signal input terminals of the multiple-input and multiple-output amplifier of the invention, and the signal output terminals of the multiple-input and multiple-output amplifier of the invention being connected to the signal output terminals of the combined multiple-input and multiple-output amplifier, in such a way that, in the known frequency band, the transfer admittance matrix of the combined multiple-input and multiple-output amplifier approximates the n×m admittance matrix $Y_G G_V$.

The person skilled in the art understands that an important feature of such a combined multiple-input and multiple-output amplifier is that the admittance matrix $Y_G G_V$ is not necessarily a square matrix. When it is a square matrix, this transfer admittance matrix $Y_G G_V$ is neither necessarily invertible nor necessarily symmetrical when $Y_G$ is symmetrical.

Consequently, the multiple-input and multiple-output amplifier of the invention can be used as a building block of another multiple-input and multiple-output amplifier, such as the combined multiple-input and multiple-output amplifier described above. The person skilled in the art understands that the multiple-input and multiple-output amplifier of the invention can also be used as a building block of other types of multiple-input and multiple-output amplifiers.

Since the product of the characteristic impedance matrix of a multiconductor transmission line, or of its inverse, by a transition matrix from modal electrical variables to natural electrical variables of this multiconductor transmission line is necessarily invertible but is usually not symmetrical, the combined multiple-input and multiple-output amplifiers described above can be used for implementing the French patent application number 03 00064 of 6 Jan. 2003, entitled "Procédé et dispositif pour la transmission avec une faible diaphonie", corresponding to the international application number PCT/EP2003/015036 of 24 Dec. 2003, entitled "Method and device for transmission with reduced crosstalk", for instance in devices implementing the equation (19), or the equation (22) or the equation (23) of these applications. In the case where the multiple-input and multiple-output amplifier of the invention is used at an end of the interconnection to provide the linear combinations defined by the equation (23) of these applications, it can also provide an output impedance matrix approximating the characteristic impedance matrix of the multiconductor transmission line, thereby simultaneously performing the functions of a transmitting circuit and of a termination circuit. We note that these applications precisely mention that the device for transmission with reduced crosstalk could be such that the termination circuits and the transmitting circuits have parts in common.

The invention claimed is:

1. A multiple-input and multiple-output amplifier comprising:
  one reference terminal, n signal input terminals and n signal output terminals, where n is an integer greater than or equal to 3,
  wherein the multiple-input and multiple-output amplifier is configured to provide, in a known frequency band, a transfer admittance matrix approximating a given admittance matrix, this given admittance matrix being a non-diagonal and invertible n×n matrix, and wherein the multiple-input and multiple-output amplifier further comprises:
  n active sub-circuits, each active sub-circuit having a sub-circuit input terminal, a sub-circuit output terminal and a sub-circuit common terminal, the sub-circuit input terminal being connected to one of said signal input terminals and the sub-circuit output terminal being connected to one of said signal output terminals, each active sub-circuit being configured such that the current flowing out of the sub-circuit common terminal and the current flowing into the sub-circuit output terminal depend on the voltage between the sub-circuit input terminal and the sub-circuit common terminal, each said signal input terminal being connected to only one sub-circuit input terminal and each said signal output terminal being connected to only one sub-circuit output terminal; and
  a feedback network having a terminal connected to said reference terminal, the feedback network also having n other terminals each being connected to the sub-circuit common terminal of one of said active sub-circuits, the feedback network presenting, in the known frequency band, a non-diagonal impedance matrix, this impedance matrix being defined with respect to said reference terminal, the feedback network producing a negative feedback such that, in the known frequency band, said transfer admittance matrix approximates said given admittance matrix.

2. The multiple-input and multiple-output amplifier of claim 1, wherein at least one of the active sub-circuits is configured such that the current flowing out of the sub-circuit common terminal and the current flowing into the sub-circuit output terminal may be considered as only depending on the voltage between the sub-circuit input terminal and the sub-circuit common terminal.

3. The multiple-input and multiple-output amplifier of claim 1, wherein said given admittance matrix is symmetrical.

4. The multiple-input and multiple-output amplifier of claim 1, wherein said feedback network is exclusively composed of linear, passive and reciprocal circuit elements.

5. The multiple-input and multiple-output amplifier of claim 1, wherein said active sub-circuits have an absolute value of the ratio of the current flowing out of the sub-circuit common terminal to the voltage between the sub-circuit input terminal and the sub-circuit common terminal much larger than the absolute values of all components of the inverse of the impedance matrix of the feedback network.

6. The multiple-input and multiple-output amplifier of claim 1, wherein at least one of the active sub-circuits is a second-generation current conveyor.

7. The multiple-input and multiple-output amplifier of claim 1, wherein at least one of the active sub-circuits behaves approximately, in the known frequency band, as a voltage-controlled current source having its negative input terminal connected to its positive output terminal.

8. The multiple-input and multiple-output amplifier of claim 1, wherein each active sub-circuit comprises an internal feedback loop, so as to obtain an output admittance matrix of the multiple-input and multiple-output amplifier approximating a wanted matrix.

9. The multiple-input and multiple-output amplifier of claim 8, wherein said given admittance matrix approximates the product of a scalar by said wanted matrix, the scalar being a real number or a complex number possibly depending on frequency.

10. The multiple-input and multiple-output amplifier of claim 1, wherein said feedback network is such that said non-diagonal impedance matrix can be adjusted by electrical means.

* * * * *